United States Patent [19]

Yanagawa

[11] Patent Number: 4,501,689
[45] Date of Patent: Feb. 26, 1985

[54] PHOTOPOLYMERIZABLE COMPOSITION

[76] Inventor: Makoto Yanagawa, No. 7-20, Minamidai 1-chome, Kamifukuoka-shi, Saitama-ken, Japan

[21] Appl. No.: 536,061

[22] Filed: Sep. 26, 1983

[51] Int. Cl.³ .............................................. H01L 13/00
[52] U.S. Cl. .............................. 252/600; 204/159.16; 204/159.22; 427/96; 428/901
[58] Field of Search ................... 204/159.16, 159.22; 252/600

[56] References Cited

U.S. PATENT DOCUMENTS 4,262,072 4/1981 Wendling et al. ......... 204/159.22 X
4,323,591 4/1982 Wendling et al. ......... 204/159.16 X Primary Examiner—Leland A. Sebastian

[57] ABSTRACT

A photopolymerizable composition used suitably as a solder resist for a printed circuit board which comprises:

(a) 0.1 to 5.0 wt. % of a s-triazine compound represented by the general formula I:

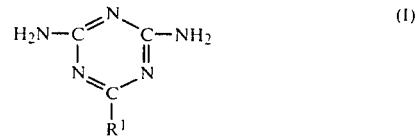

[wherein $R^1$ stands for

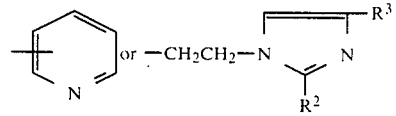

(wherein $R^2$ stands for a hydrogen atom, an alkyl group or a phenyl group and $R^3$ stands for a hydrogen atom or a lower alkyl group)];

(b) 5 to 50 wt. % of a photopolymerizable oligomer which has an average molecular weight in the range of 200 to 4000 and has 2 or more of acryloyl groups or methacryloyl groups in a molecule;

(c) 5 to 50 wt. % of vinyl monomer having 1 or more of acryloyl groups or methacryloyl groups which are liquid at 50° C.;

(d) 0.5 to 5 wt. % of a photo-initiator which acts to initiate a cross-linking reaction between said photopolymerizable oligomer and said vinyl monomer when subjected to activated radiation; and (e) 5 to 60 wt. % of an inorganic filler.

18 Claims, No Drawings

PHOTOPOLYMERIZABLE COMPOSITION

BACKGROUND OF THE INVENTION

1. Field of the Invention

The present invention relates to a photopolymerizable composition. More particularly, the present invention relates to a photopolymerizable composition usable especially as a solder resist for coating a printed circuit board which can produce a coated film possessing an excellent rust prevention for a copper-foiled pattern in addition to the superior characteristics such as thermal resistance and mechanical and electrical characteristics.

2. Description of the Prior Art

Of late, a solder resist has been employed in soldering a printed circuit board. This solder resist is such as to be coated on a printed circuit board for the purposes of reducing the amount of solder to be used; preventing the occurrence of solder's bridging; protecting the board from oxidation or from gases such as sulfur dioxide, hydrogen sulfide and the like; improving the insulating characteristic of the board; preventing the copper-foiled pattern from rusting; and further preventing the board from warping. In view of the facts that the solder resist, as mentioned above, acts as a soldering mask for the printed circuit board in soldering and further acts as a coating film for protecting the board permanently, the solder resist must satisfy various requirements. That is, the solder resist must have the following characteristics: (1) thermal resistance and anti-solubility during hot process in soldering, (2) stiff close adherence and adhesive property to the printed circuit board, (3) excellent electric characteristics, (4) a small degree of deterioration even under the high temperature and humidity conditions and the like. In general, since the solder resist is designed to be coated after a desired pattern on the print circuit board by the screen printing method, it also becomes necessary for the solder resist to possess the characteristics required for a printing ink such, for instance, as the print-definition and fluidity for permitting the accurate regeneration of the image of the screen.

As the solder resists there have usually been used the ink compositions of thermo-setting type which are consisted essentially of thermo-setting resins such as alkyd-melamine resin, epoxy resin and the like and further contain organic solvents. Of late, however, there have been used, as the solder resists, photopolymerizable ink compositions with the intention of shortening the setting time, improving the working properties and improving the environmental problems such as air pollution caused by the use of organic solvents or the like. This photopolymerizable solder resist is consisted essentially of the acrylate oligomer represented by epoxy acrylate and urethane acrylate and of the vinyl monomer such as acrylate, and can be cured readily by exposing it to activated radiation of ultraviolet ray, electron-beam or the like. U.S. Pat. No. 3,772,062, U.S. Pat. No. 4,014,771, U.S. Pat. No. 4,271,258 and the like is reporting that epoxy acrylate is superior in the properties of light sensitivity, hardness, solvent resistance, thermal resistance and the like. Referring to urethane acrylate, whilst, U.S. Pat. No. 4,072,770 and the like report that urethane acrylate is superior in flexibility, adhesive property and the like.

The above photopolymerizable composition is obtained in the manner that the oligomer containing an acryloyl group or a methacryloyl group and the monomer containing an acryloyl group or a methacryloyl group are cross linked by the radical reaction of vinyl groups and cured. As is generally known, however, this curing reaction is followed by a very hard curing contraction, thereby deteriorating the close adherence and adhesive property between the resulting coated film and printed circuit board. Further, there remains such a defect that the unreacted monomer present in the cured coated film corrodes the copper-foiled pattern of the printed circuit board, which is remarkable especially when left standing at high temperature and humidity for a long period of time.

U.S. Pat. No. 4,320,189 proposes that a halogen atom (such as melamine, guanamine, acetoguanamine, benzoguanamine, ethyldiamino-s-triazine, 2,4-diamino-s-triazine, 2,4-diamino-6-tolyl-s-triazine or the like)-, an alkyl group-, amino group-, alkylamino group- or allyl group- substituted s-triazine compound be added to the photoresist composition in order to improve the adhesive property of the coated film to the board. Even if this composition be utilized as the solder resist in this instance, the adhesive property of the resulting coated film to the copper surface may be improved somewhat, but the rust prevention of copper foil is insufficient. As melamine is not well dispersive, moreover, there can not be obtained a smooth coated film.

In order to improve the rust prevention of copper foil, still more; it has usually been tried to add imidazoles such as benzimidazole, imidazolecarboxylic acid, dimethylimidazole, isopropylimidazole, undecylimidazole, 2-methyl benzthiazole, 2-mercaptobenzimidazole, benztriazole, 1-chlorobenzotriazole and the like; and their derivatives to the ink composition for solder resist, but no satisfactory effect has been achieved yet.

SUMMARY OF THE INVENTION

It is an object of the present invention to provide a photopolymerizable composition which can prevent the copper foil from rusting effectively very much and can be suitably used as an ink composition for solder resist.

The present inventors have devoted themselves to a series of studies of the photopolymerizable composition containing a photopolymerizable oligomer, a liquid vinyl monomer, a photo-initiator and an inorganic filler to find that the rust prevention can be improved by adding a pyridyl group-substituted or a substituted or unsubstituted 2-(1-imidazolyl)ethyl group-substituted diamino-s-triazine to said composition.

The photopolymerizable composition according to the present invention is characterized by comprising the following components (a) to (e):

(a) 0.1 to 5.0 wt. % of a s-triazine compound represented by the general formula I

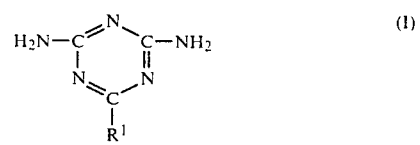

[wherein $R^1$ stands for

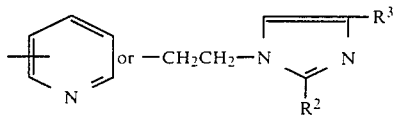

(wherein R² stands for a hydrogen atom, an alkyl group or a phenyl group and R³ stands for a hydrogen atom or a lower alkyl group)];
(b) 5 to 50 wt. % of a photopolymerizable oligomer which has an average molecular weight in the range of 200 to 4000 and has 2 or more of acryloyl groups or methacryloyl groups in one molecule;
(c) 5 to 50 wt. % of vinyl monomer having one or more of acryloyl groups or methacryloyl groups which are liquid at 50° C.;
(d) 0.5 to 5 wt. % of a photo-initiator which acts to initiate a cross-linking reaction between said photopolymerizable oligomer and said vinyl monomer upon activated radiation; and
(e) 5 to 60 wt. % of an inorganic filler.

DETAILED DESCRIPTION OF THE INVENTION

The s-triazine compound represented by the general formula (I) (which is called (a) component) acts to exert a rust prevention effect upon a copper foil, and can be enumerated concretely as follows:
2,4-diamino-6-pyridyl-s-triazine, 2,4-diamino-6-[2-methyl-(1-imidazolyl)]ethyl-s-triazine, 2,4-diamino-6-[2,4-dimethyl-(1-imidazolyl]ethyl-s-triazine, 2,4-diamino-6-[2-ethyl-(1-imidazolyl)]ethyl-s-triazine, 2,4-diamino-6-[2-phenyl-(1-imidazolyl)]ethyl-s-triazine, and 2,4-diamino-6-[2-dodecyl-(1-imidazolyl)]ethyl-s-triazine. It is preferable that this triazine compound be added to the composition in an amount of 0.1 to 5.0 wt. %, more preferably in an amount of 0.2 to 1.0 wt. %. When the amount of said triazine compound added is less than 0.1 wt. %, there can not be obtained a satisfactory rust prevention result. When said amount is more than 5.0 wt. %, whilst, an unfavorable influence is exerted upon the photopolymerizability of the composition.

The component (b), namely the photopolymerizable oligomer which has an average molecular weight ranging from 200 to 4000 and has 2 or more of acryloyl groups or methacryloyl groups in one molecule, acts to cure together with (c) vinyl monomer so as to form a coated film. When the molecular weight of the oligomer is less than 400, the formed coated film lacks a leveling property, has a large volume contraction coefficient, is brittle and has a deteriorated close adhering property. Whilst, when said molecular weight is more than 4,000, the density of the acryloyl groups or the methacryloyl groups contained in one molecule is lowered and consequently the curing property deteriorates, and further the resulting coated film is inferior in heat resisting property. This oligomer is contained in the composition in an amount of 5 to 50 wt. %.

As the above mentioned oligomer, there is typically used epoxy acrylate, epoxy methacrylate, urethane acrylate or urethane methacrylate. The epoxy acrylate or epoxy methacrylate is a product obtained by reacting an epoxy compound having 2 or more of epoxy groups with an acrylic acid or a methacrylic acid. As this epoxy compound, there can be enumerated the following compounds:
(1) a glycidyl ether type epoxy compound obtained by reacting bisphenol or novolak with epichlorohydrine or methyl epichlorohydrine,
(2) a glycidyl ether type epoxy compound of a bisphenol alkylene oxide addition product obtained by adding alkylene oxide to bisphenol and further reacting the same with epichlorohydrin or methyl epichlohydrin,
(3) an aliphatic epoxide or an alicyclic epoxide obtained by subjecting an aliphatic or alicyclic olefin to epoxidation, and
(4) an epoxidated polybutadiene obtained by subjecting polybutadiene to epoxidation.

Said urethane acrylate or urethane methacrylate is a product obtained by reacting an isocyanate oligomer having 2 or more of isocyanate groups with an acrylic ester having a hydroxyl group or a methacrylic ester. Said isocyanate oligomer can be obtained by reacting for instance di-, tri- or tetraol with a polyfunctional isocyanate.

The component (c), namely the vinyl monomer having one or more of acryloyl groups or methacryloyl groups which are liquid at 50° C., is added for the purpose of improving the working property upon oligomer manufacturing and the working property upon forming a coated film by the screen printing method using a photopolymerizable composition as an ink, and additionally for the purpose of controlling the curing velocity and the characteristics of the coated film to be cured. This vinyl monomer is preferably added to the composition in an amount of 5 to 50 wt. %, preferably 10 to 40 wt. %. The concrete examples of said vinyl monomer includes acrylates such as 2-hydroxypropylacrylate, ethylene glycol monoacrylate, glycidyl acrylate, 2-ethylhexyl acrylate, lauryl acrylate, tetrahydrofurfural acrylate, methoxy diethylene glycol acrylate, 2-hydroxy alkyl acrylate, aminoalkyl acrylate and the like or derivatives thereof; methacrylates corresponding thereto or derivatives thereof; polyfunctional acrylates such as trimethylol propane triacrylate, pentaerythritol triacrylate, butane diol diacrylate, hexan diol diacrylate, neopentyl glycol diacrylate, glycerol triacrylate, dipentaerythritol hexaacrylate, polyethylene glycol diacrylate, tetramethylolmethane triacrylate, tetra methylolmethane tetraacrylate and the like or methacrylates corresponding thereto. They may be used either alone or in mixture.

The component (d), namely the photo-initiator, acts to initiate a cross linking reaction between the photopolymerizable oligomer (b) and the vinyl monomer (c) upon activated radiation, and is preferable that it is added to the composition in an amount of 0.5 to 5 wt. %, preferably 1 to 3 wt. %. As this photo-initiator, there can be enumerated benzoin compounds such as benzoin, benzoin methyl ether, benzoin ethyl ether, benzoin isopropyl ether, benzoin isobutyl ether and the like, benzophenone compounds such as benzophenone, p-dimethylamino benzophenone, p,p'-tetramethylamino benzophenone and the like, ketone compounds such as benzyl, diacetyl ketone and the like, anthraquinone compounds such as anthraquinone, 1-chloroanthraquinone, 2-methylanthraquinone, 2-amylanthraquinone and the like, and the like. These photo-initiators may be used either alone or in mixture, and further may be used concurrently with such a chain transfer agent as an organic amine.

The component (e), namely the inorganic filler, is the one which functions to improve the print-definition requisite for coating a photopolymerizable composition on a board such as a printed circuit board by using the screen printing method. This is added to the composition in an amount of 5 to 60 wt. %, preferably in an amount of 20 to 40 wt. %. The concrete examples of said inorganic filler include silica, calcium carbonate, clay, talc, barium sulfate, barium carbonate, alumina, hydrated alumina, mica and the like. Among them, the talc is most preferable. By mixing 20 to 40 wt. % of the talc to the composition, the print-definition and the close adherence of the coated film can be improved markedly.

It is also possible to add a thermopolymerization inhibitor to the composition in an amount of about 0.01 to 1.0 wt. % with the object of preventing the composition from gelation, enhancing its shelf life and controlling the curing velosity of the composition. As the thermopolymerization inhibitor, there can be enumerated hydroquinone, hydroquinone monomethyl ether, 2-tert-butyl catechol, guaiacol, resorcin, phenothazine, copper benzoate, copper naphthenate, copper oxide and the like.

Pigments such as Victoria Blue, Phthalocyanine Blue, Hansa Yellow, Eosine and the like, a levelling agent and a thixotrapping agent may also be added to the composition.

EXAMPLE 1

100 parts by weight of epoxy acrylate resin (Epikote Acrylate #370, manufactured by Shell Co., Ltd.), 50 parts by weight of trimethyl propane triacrylate and 30 parts by weight of 2-hydroxy propyl acrylate (vinyl monomers) and 3 parts by weight of 2-methyl anthraquinone (photo-initiator) were mixed. To this mixture, further, were added 25 parts by weight of talc (filler) and 0.6 part by weight of Phthalocyanine Green (coloring agent). The thus obtained mixture was admixed with 1.0 part by weight of 2,4-diamino-6-(4-pyridyl)-s-triazine(s-triazine compound), and the same was mingled by means of a three roll mill thereby to obtain the photopolymerizable composition No. 1-1 of the present invention.

EXAMPLE 2

By repeating the exactly same procedure as Example 1 except that 1 part by weight of 2,4-diamino-6-[2-methyl-(1-imidazolyl)]ethyl-s-triazine was used in place of the s-triazine of Example 1 there was obtained the composition No. 1-2 of the present invention.

EXAMPLE 3

100 parts by weight of urethane acrylate resin (UNIDIC V-4601, manufactured by DAINIPPON INK KAGAKU KOGYO K.K.), 50 parts by weight of pentaerythritol triacrylate and 50 parts by weight of ethylene glycol mono methacrylate (vinyl monomers) and 1 part by weight of 1,4-dimethyl anthraquinone and 1 part by weight of benzoin ethyl ether (photo-initiators) were mixed. The resulting mixture was further admixed with 10 parts by weight of borium sulfate (filler), 0.6 part by weight of Phthalocyanine Green (coloring agent) and 2 parts by weight of Modaflow (manufactured by Monsant Co., Ltd.) (leveling agent) and mingled. This mixture was further admixed with 1 part by weight of 2,4-diamino-6-(4-pyridyl)-s-triazine(s-triazine compound), and the same was mingled by using a three roll mill to thereby obtain the composition No. 1-3 of the present invention.

EXAMPLE 4

By repeating the exactly same procedure as Example 3 except that 1 part by weight of 2,4-diamino-6-[2-phenyl-(1-imidazolyl)]ethyl-s-triazine was used as the s-triazine compound there was obtained the composition No. 1-4 of the present invention.

EXAMPLE 5

By repeating the exactly same procedure as Example 3 except that 2,4-diamino-6-[2,4-dimethyl-(1-imidazolyl)]ethyl-s-triazine was used as the s-triazine compound there was obtained the composition No. 1-5 of the present invention.

COMPARATIVE EXAMPLE 1

A comparative composition was obtained by repeating the exactly same procedure as Example 1 except that the 2,4-diamin-6-(4-pyridyl)-s-triazine was not added.

COMPARATIVE EXAMPLES 2 TO 4

By repeating the exactly same procedure as Example 1 except that 1 part by weight of each compound listed in Table 1 was added in place of the 2,4-diamino-6-(4-pyridyl)-s-triazine there were obtained comparative composition No. 2-2 to 2-4.

TABLE 1

| Composition No. | Compound to be added |
| --- | --- |
| 2-2 | benzotriazole |
| 2-3 | melamine |
| 2-4 | 2,4-diamino-6-ethyl-s-triazine |

The thus obtained composition No. 1-1 to No. 1-5 according to the present invention and the thus obtained comparative composition No. 2-1 to No. 2-4 were each used as ink. The composition was coated on the copper foil of a printed circuit board so as to have a thickness of 20 μm by means of the screen printing method, was subjected to ultraviolet radiation for 5 seconds from a distance of 10 cm by means of an output 80 W/cm-high pressure mercury lamp and was cured thereby to prepare a test piece.

This test piece was left standing under the conditions (temperature 60° C. and relative humidity 90 to 95%) for 200 hours. Thus, the state of rust gathering on the copper foil covered by the coated film was observed with the naked eye, and was evaluated according to the following standards. The obtained results were as shown in Table 2:

TABLE 2

| Composition No. | Valuation |
| --- | --- |
| 1-1 | A |
| 1-2 | A |
| 1-3 | A |
| 1-4 | A |
| 1-5 | A |
| 2-1 | C |
| 2-2 | B |
| 2-3 | B |
| 2-4 | B |

A: Rust not observed
B: Rust observed
C: Slight rust gathered

It can be found from Table 2 that the photopolymerizable compositions according to the present invention are exceedingly effective in rust preventing.

The coating film obtained from composition No. 2-3 was found not preferable additionally in its inferior smoothness.

What is claimed is:

1. A photopolymerizable composition which comprises:
   (a) 0.1 to 5.0 wt. % of a s-triazine compound represented by general formula I:

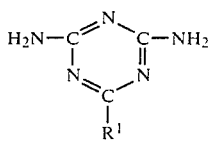

[wherein R¹ stands for

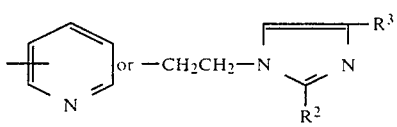

(wherein R² stands for a hydrogen atom, an alkyl group or a phenyl group and R³ stands for a hydrogen atom or a lower alkyl group)];
   (b) 5 to 50 wt. % of a photopolymerizable oligomer which has an average molecular weight in the range of 200 to 4000 and has 2 or more of acryloyl groups or methacryloyl groups in a molecule;
   (c) 5 to 50 wt. % of vinyl monomer having 1 or more of acryloyl groups or methacryloyl groups which are liquid at 50° C.;
   (d) 0.5 to 5 wt. % of a photo-initiator which acts to initiate a cross-linking reaction between said photopolymerizable oligomer and said vinyl monomer when subjected to activated radiation; and
   (e) 5 to 60 wt. % of an inorganic filler.

2. A photopolymerizable composition according to claim 1 wherein said (a) s-triazine compound is the one represented by the general formula I
[wherein R¹ stands for

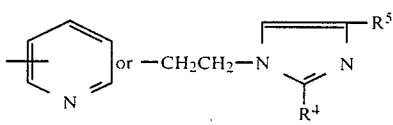

(wherein R⁴ stands for a methyl group, an ethyl group, a dodecyl group or a phenyl group, and R⁵ stands for a hydrogen atom or a methyl group)].

3. A photopolymerizable composition according to claim 1 wherein said (a) s-triazine compound is 2,4-diamino-6-pyridyl-s-triazine, 2,4-diamino-6-[2-methyl-(1-imidazolyl)]ethyl-s-triazine, 2,4-diamino-6-[2,4-dimethyl-(1-imidazolyl)]ether-s-triazine, 2,4-diamino-6-[2-ethyl-(1-imidazolyl)]ethyl-s-triazine, 2,4-diamino-6-[2-phenyl-(1-imidazolyl)]ethyl-s-triazine or 2,4-diamino-6-[2-dodecyl-(1-imidazolyl)]ethyl-s-triazine.

4. A photopolymerizable composition according to claim 1 wherein said (a) s-triazine compound is 2,4-diamino-6-(4-pyridyl)-s-triazine, 2,4-diamino-6-[2-methyl-(1-imidazolyl)]ethyl-s-triazine, 2,4-diamino-6-[2,4-dimethyl-(1-imidazolyl)]ethyl-s-triazine, or 2,4-diamino-6-[2-phenyl-(1-imidazolyl)]ethyl-s-triazine.

5. A photopolymerizable composition according to claim 1 wherein said (a) s-triazine compound is contained in an amount of 0.2 to 1.0 wt. %.

6. A photopolymerizable composition according to claim 1 wherein said (b) oligomer is epoxy acrylate or epoxy methacrylate.

7. A photopolymerizable composition according to claim 1 wherein said (b) oligomer is urethane acrylate or urethane methacrylate.

8. A photopolymerizable composition according to claim 1 wherein said (c) vinyl monomer is acrylate or methacrylate.

9. A photopolymerizable composition according to claim 1 wherein said (e) inorganic filler is silica, calcium carbonate, clay, talc, barium sulfate, barium carbonate, alumina, hydrated alumina or mica.

10. A photopolymerizable composition according to claim 1 which is used as a solder resist for a printed circuit board.

11. A photopolymerizable composition which comprises:
    (a) 0.1 to 5.0 wt. % of a S-triazine compound represented by the general formula I:

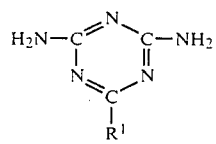

[wherein R¹ stands for

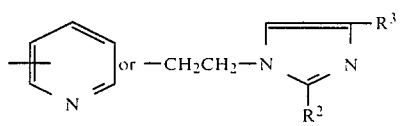

(wherein R² stands for a hydrogen atom, an alkyl group or a phenyl group and R³ stands for a hydrogen atom or a lower alkyl group)];
    (b) 5 to 50 wt. % of a photopolymerizable oligomer which has an average molecular weight in the range of 200 to 4000 and has 2 or more of acryloyl groups or methacryloyl groups in a molecule, said oligomer being selected from the group consisting of epoxyacrylate, epoxymethacrylate, urethane acrylate and urethane methacrylate;
    (c) 5 to 50 wt. % of acrylate monomer or methacrylate monomer having 1 or more of acryloyl groups or methacryloyl groups which are liquid at 50° C.;
    (d) 0.5 to 5 wt. % of a photo-initiator which acts to initiate a cross-linking reaction between said photopolymerizable oligomer and said acrylate monomer or methacrylate monomer; and
    (e) 5 to 60 wt. % of an inorganic filler.

12. A photopolymerizable composition according to claim 11 wherein said (a) s-triazine compound is the one represented by the general formula I
[wherein R¹ stands for

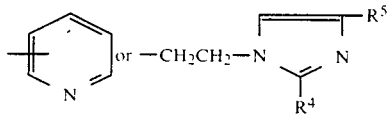

(wherein R⁴ stands for a methyl group, an ethyl group, a dodecyl group or a phenyl group, and R⁵ stands for a hydrogen atom or a methyl group)].

13. A photopolymerizable composition according to claim 11 wherein said (a) s-triazine compound is 2,4-diamino-6-pyridyl-s-triazine, 2,4-diamino-6-[2-methyl-(1-imidazolyl)]ethyl-s-triazine, 2,4-diamino-6-[2,4-dimethyl-(1-imidazolyl)]ethyl-s-triazine, 2,4-diamino-6-[2-ethyl-(1-imidazolyl)]ethyl-s-triazine, 2,4-diamino-6-[2-phenyl-(1-imidazolyl)]ethyl-s-triazine, or 2,4-diamino-6-[2-dodecyl-(1-imidazolyl)]ethyl-s-triazine.

14. A photopolymerizable composition according to claim 11 wherein said (a) s-triazine compound is 2,4-diamino-6-(4-pyridyl)-s-triazine, 2,4-diamino-6-[2-methyl-(1-imidazolyl)]ethyl-s-triazine, 2,4-diamino-6-[2,4-dimethyl-(1-imidazolyl)]ethyl-s-triazine.

15. A photopolymerizable composition according to claim 11 wherein said (a) s-triazine compound is contained in an amount of 0.2 to 1.0 wt. %.

16. A photopolymerizable composition according to claim 11 wherein said (b) oligomer is epoxy acrylate or epoxy methacrylate.

17. A photopolymerizable composition according to claim 11 wherein said inorganic filler is silica, calcium carbonate, clay, talc, barium sulfate, barium carbonate, alumina, hydrated alumina or mica.

18. A photopolymerizable composition according to claim 11 which is used as a solder resist for a printed circuit board.

* * * * *